United States Patent
Reddy et al.

(10) Patent No.: US 9,411,669 B2
(45) Date of Patent: Aug. 9, 2016

(54) SELECTIVE SAMPLING OF DATA STORED IN NONVOLATILE MEMORY

(71) Applicant: SanDisk Technologies Inc., Plano, TX (US)

(72) Inventors: Gautham Kumar Reddy, San Jose, CA (US); Niles Yang, Mountain View, CA (US); Alexandra Bauche, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 152 days.

(21) Appl. No.: 14/483,915

(22) Filed: Sep. 11, 2014

(65) Prior Publication Data

US 2016/0077903 A1    Mar. 17, 2016

(51) Int. Cl.
G11C 29/00    (2006.01)
G06F 11/07    (2006.01)
G11C 16/16    (2006.01)
G06F 11/10    (2006.01)

(52) U.S. Cl.
CPC .......... *G06F 11/076* (2013.01); *G06F 11/0727* (2013.01); *G06F 11/0793* (2013.01); *G06F 11/1008* (2013.01); *G06F 11/1044* (2013.01); *G11C 16/16* (2013.01)

(58) Field of Classification Search
CPC . G11C 29/00; G06F 11/1008; G06F 11/1076; G06F 11/1044; G06F 11/1068
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,035,007 A * | 3/2000 | Khayrallah | H03M 13/01 375/341 |
| 6,046,935 A | 4/2000 | Takeuchi et al. | |
| 6,222,762 B1 | 4/2001 | Guterman et al. | |
| 6,957,379 B1 * | 10/2005 | Patapoutian | G11B 20/10009 360/31 |
| 8,082,475 B2 * | 12/2011 | Ferraiolo | G06F 11/0724 714/704 |
| 8,611,149 B2 * | 12/2013 | Roohparvar | G11C 16/10 365/185.03 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Esaw Abraham

(74) *Attorney, Agent, or Firm* — Davis Wright Tremaine LLP

(57) ABSTRACT

Data stored in a nonvolatile memory is selectively sampled based on write-erase cycle counts of blocks. Blocks with the lowest write-erase cycle counts are sampled to determine an error rate which is compared with a limit. If the error rate exceeds the limit then the sample is expanded to include blocks with the next lowest write-erase cycle counts.

25 Claims, 15 Drawing Sheets

(56) References Cited

U.S. PATENT DOCUMENTS

| | | | | |
|---|---|---|---|---|
| 8,750,042 B2 * | 6/2014 | Sharon | ............... | G11C 11/5642 365/185.03 |
| 8,793,556 B1 * | 7/2014 | Northcott | ............ | G06F 11/1068 365/185.29 |
| 9,183,085 B1 * | 11/2015 | Northcott | ............ | G06F 11/1068 |
| 2012/0220088 A1 | 8/2012 | Alsmeier | | |
| 2013/0107628 A1 | 5/2013 | Dong et al. | | |
| 2013/0229846 A1 | 9/2013 | Chien et al. | | |
| 2013/0346805 A1 | 12/2013 | Sprouse et al. | | |
| 2013/0346812 A1 * | 12/2013 | Bahirat | ................ | G11C 16/349 714/704 |
| 2014/0136884 A1 | 5/2014 | Werner et al. | | |

* cited by examiner

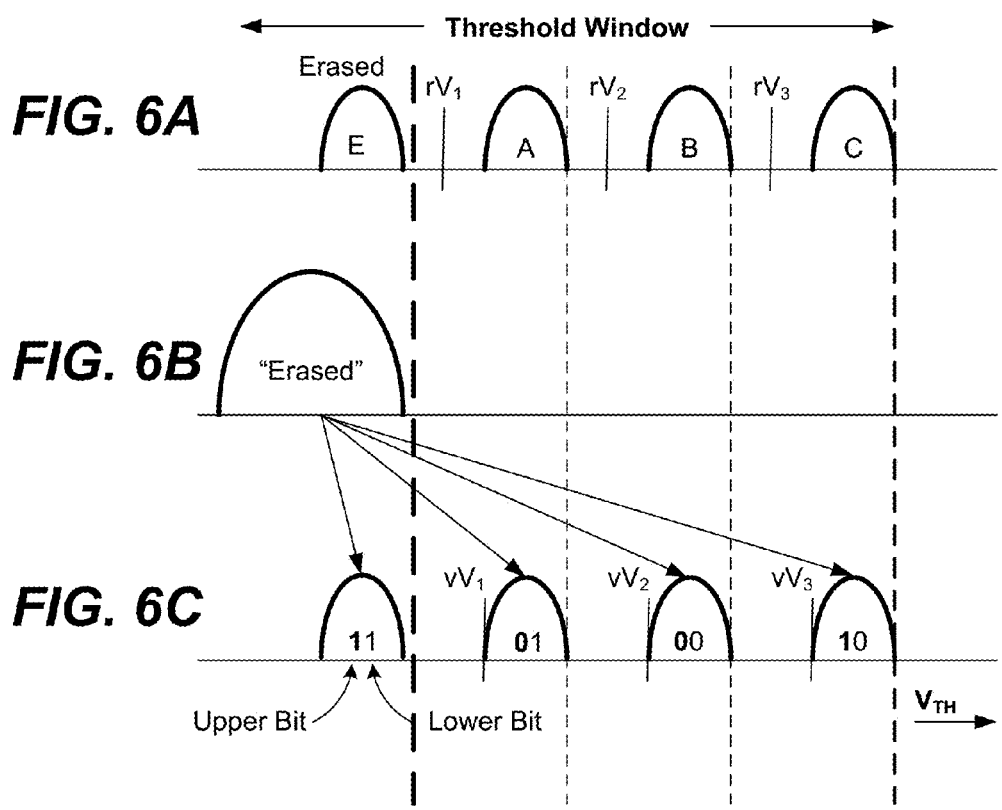
Programming into four states represented by a 2-bit code

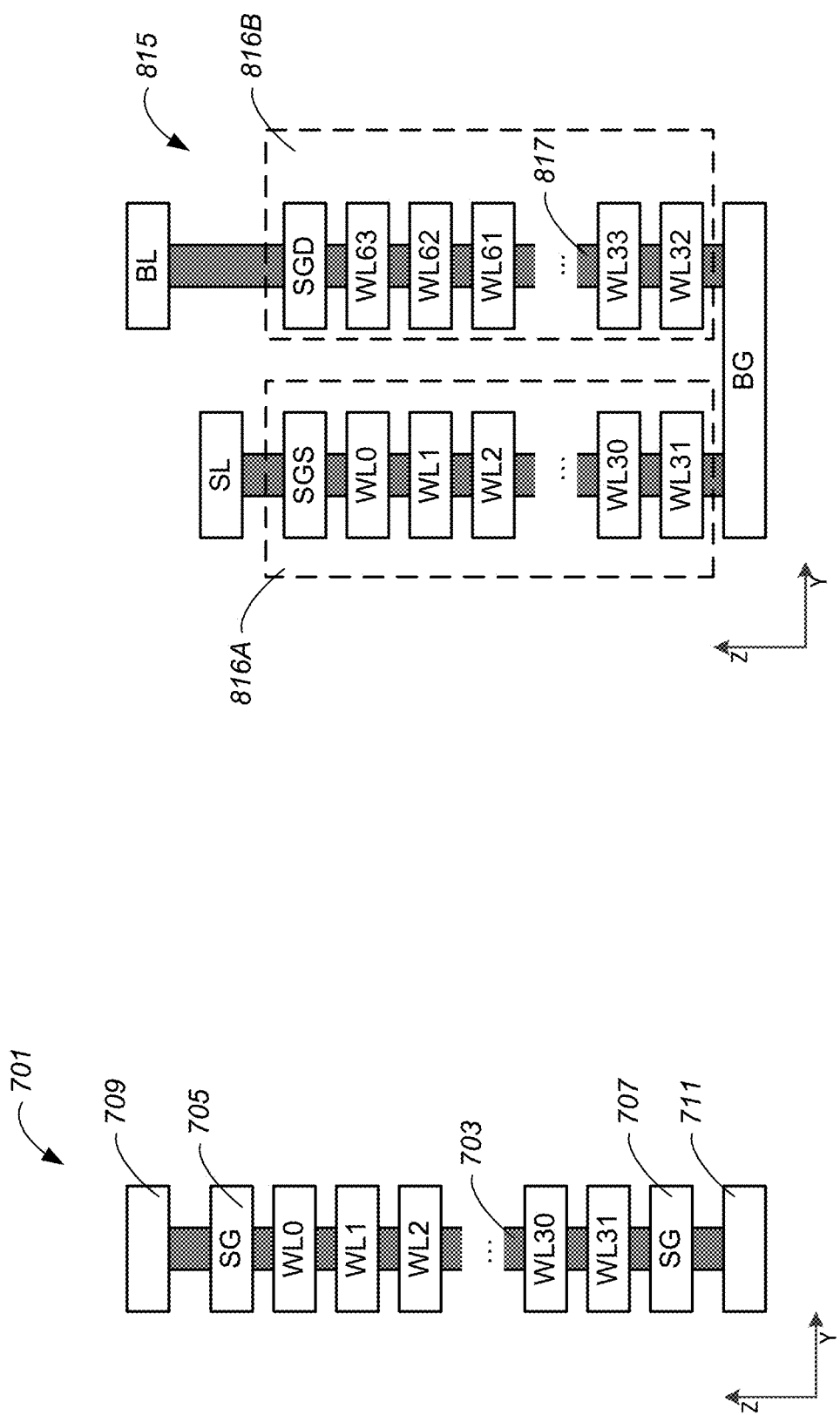

SELECTIVE SAMPLING OF DATA STORED IN NONVOLATILE MEMORY

BACKGROUND

This application relates to the operation of re-programmable nonvolatile memory systems including semiconductor flash memory systems.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that is applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Resistive RAM (ReRAM) uses changes in electrical resistance of certain materials to record data. Various other nonvolatile memories are also in use or proposed for use in nonvolatile memory systems.

In many nonvolatile memory systems errors occur in data during storage in a memory. Such errors may be detected and corrected by Error Correction Codes (ECC) when the data is read if the error rate is low. Data with a high error rate may become Uncorrectable by ECC (UECC). Therefore it is desirable to identify data that is degraded before it becomes UECC.

SUMMARY

In order to efficiently identify data with elevated error rates in a nonvolatile memory, a sample population of blocks with the lowest write-erase cycle counts are sampled to determine their error rates. Another sample population of blocks with the highest write-erase cycle counts may also be sampled to determine their error rates. Focusing on either end of the write-erase cycle spectrum reduces the number of blocks sampled while efficiently identifying bad data so that remedial action can be taken. As a memory is used, the size of the sample population, or populations, may increase, thereby adapting to increased error rates.

An example of a method of identifying high error rate data in a block-erasable nonvolatile memory includes: (a) maintaining individual write-erase cycle counts for a plurality of blocks of the nonvolatile memory; (b) selecting a first subset of the plurality of blocks for error rate sampling, the first subset consisting of blocks with the lowest write-erase cycle counts of the plurality of blocks; (c) sampling data stored in the first subset of the plurality of blocks to estimate a first error rate for the first subset of the plurality of blocks; (d) comparing the first error rate with a first limit; (e) in response to determining that the first error rate exceeds the first limit, expanding the first subset to include additional blocks with next lowest write-erase cycle counts of the plurality of blocks; and (f) repeating steps (c)-(e).

The method may also include: (g) selecting a second subset of the plurality of blocks for error rate sampling, the second subset consisting of blocks with the highest write-erase cycle counts of the plurality of blocks; (h) sampling data stored in the second subset of the plurality of blocks to estimate a second error rate for the second subset of the plurality of blocks; (i) comparing the second error rate with a second limit; (j) in response to determining that the second error rate exceeds the second limit, expanding the second subset to include additional blocks with the next highest write-erase cycle counts of the plurality of blocks; and (k) repeating steps (h)-(j). Sampling data to estimate block error rates of the first and second subsets of the plurality of blocks may be repeated during product use. Sampling data to estimate block error rates of the first and second subsets of the plurality of blocks may be repeated at write-erase cycle count intervals. The first subset of the plurality of blocks selected in step (b) may consist of a first percentage of the plurality of blocks having the lowest write-erase cycle counts and the second subset of the plurality of blocks selected in step (g) may consist of a second percentage of the plurality of blocks having the highest write-erase cycle counts. The first subset may be expanded in step (e) to consist of a third percentage of the plurality of blocks having the lowest write-erase cycle counts, the third percentage being greater than the first percentage, and the second subset of the plurality of blocks may be expanded in step (j) to consist of a fourth percentage of the plurality of blocks having the highest write-erase cycle counts, the fourth percentage being greater than the second percentage. In response to determining that an individual block of the first subset or the second subset of the plurality of blocks has a block error rate that exceeds a maximum block error rate data recovery operations on the individual block may be performed. The maximum block error rate may correspond to data that is correctable by an Error Correction Code (ECC) scheme that is used to encode data prior to storage in the plurality of blocks and to decode data that is read from the plurality of blocks. Performing the data recovery operations on the individual block may include reading data from the individual block, correcting the data from the individual block using the ECC scheme, writing the data that is corrected to a destination block, and erasing the individual block. Sampling data stored in the first subset of the plurality of blocks may include reading data from at least one word line in each block of the first subset of the plurality of blocks and sampling data stored in the second subset of the plurality of blocks may include reading data from at least one word line in each block of the second subset of the plurality of blocks. The first error rate may be estimated by averaging individual error rates of all blocks of the first subset of the plurality of blocks and the second error rate may be estimated by averaging individual error rates of all blocks of the second subset of the plurality of blocks. Blocks of the first plurality of blocks and the second plurality of blocks may be sorted in order of individual error rates and subsequently data recovery operations may be performed on the blocks of the first plurality of blocks and the second plurality of blocks in the order of individual error rates. The block erasable nonvolatile memory may be monolithically formed in two or more physical levels of memory cells having an active area disposed above a silicon substrate.

An example of a block erasable nonvolatile memory system includes: a plurality of individually erasable blocks of memory cells; a write-erase cycle count circuit that maintains individual write-erase cycle counts for each of the plurality of individually erasable blocks; a data sampling circuit that samples stored data from selected blocks of the plurality of individually erasable blocks; an error rate estimation circuit that estimates an error rate from data sampled by the data sampling circuit; and a selecting circuit that selects the selected blocks for the sampling circuit to sample based on corresponding individual write-erase cycle counts maintained by the write-erase cycle count circuit, the selected blocks comprising a subset of the plurality of individually erasable blocks with the lowest individual write-erase cycle counts of the plurality of individually erasable blocks, with additional blocks added to the subset when the error rate estimation circuit indicates that the error rate is greater than a limit.

The selected blocks may include another subset of blocks with the highest individual write-erase cycle counts of the plurality of blocks. The data sampling circuit may be configured to perform sampling repeatedly during product use. The data sampling circuit may be configured to perform the sampling repeatedly at write-erase cycle count intervals. The selecting circuit may be initially configured to select selected blocks that consist of about 0.1% of the plurality of blocks with the lowest write-erase cycle counts and about 0.1% of the plurality of blocks with the highest write-erase cycle counts and to subsequently add blocks to the subset and to the additional subset. A data recovery system may recover data from blocks containing data with an error rate that exceeds a maximum block error rate. An Error Correction Code (ECC) circuit may encode data prior to storage in the block erasable nonvolatile memory and may decode data that is read from the block erasable nonvolatile memory, the ECC circuit having a correcting capacity that is greater than the maximum block error rate. The data with an error rate that exceeds the maximum block error rate may be corrected by the ECC circuit and stored in another block. The data sampling circuit may be configured to read data from at least one word line of each of the selected blocks. An error rate estimation circuit may estimate the first error rate from an average of errors in read data from each of the selected blocks. The block erasable nonvolatile memory may be monolithically formed in two or more physical levels of memory cells having an active area disposed above a silicon substrate.

An example of a method of identifying high error rate data in a block-erasable nonvolatile memory includes: (a) maintaining individual write-erase cycle counts for a plurality of blocks of the nonvolatile memory; (b) selecting a first subset of the plurality of blocks for error rate sampling, the first subset consisting of blocks with the lowest write-erase cycle counts of the plurality of blocks; (c) sampling data stored in the first subset of the plurality of blocks by reading at least one word line from each block of the first subset of the plurality of blocks to estimate a first error rate for the first subset of the plurality of blocks; (d) comparing the first error rate with a first limit; (e) in response to determining that the first error rate exceeds the first limit, expanding the first subset to include additional blocks with next lowest write-erase cycle counts of the plurality of blocks; (f) repeating steps (c)-(e) at write erase cycle count intervals; (g) selecting a second subset of the plurality of blocks for error rate sampling, the second subset consisting of blocks with the highest write-erase cycle counts of the plurality of blocks; (h) sampling data stored in the second subset of the plurality of blocks by reading at least one word line in each block of the second subset of the plurality of blocks to estimate a second error rate for the second subset of the plurality of blocks; (i) comparing the second error rate with a second limit; (j) in response to determining that the second error rate exceeds the second limit, expanding the second subset to include additional blocks with the next highest write-erase cycle counts of the plurality of blocks; (k) repeating steps (h)-(j) at write erase cycle count intervals; and (l) sorting blocks of the first plurality of blocks and the second plurality of blocks in order of individual error rates and subsequently performing data recovery operations on the blocks of the first plurality of blocks and the second plurality of blocks in the order of individual error rates.

Various aspects, advantages, features and embodiments are included in the following description of examples, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

DETAILED DESCRIPTION

Memory System

Figure 1:
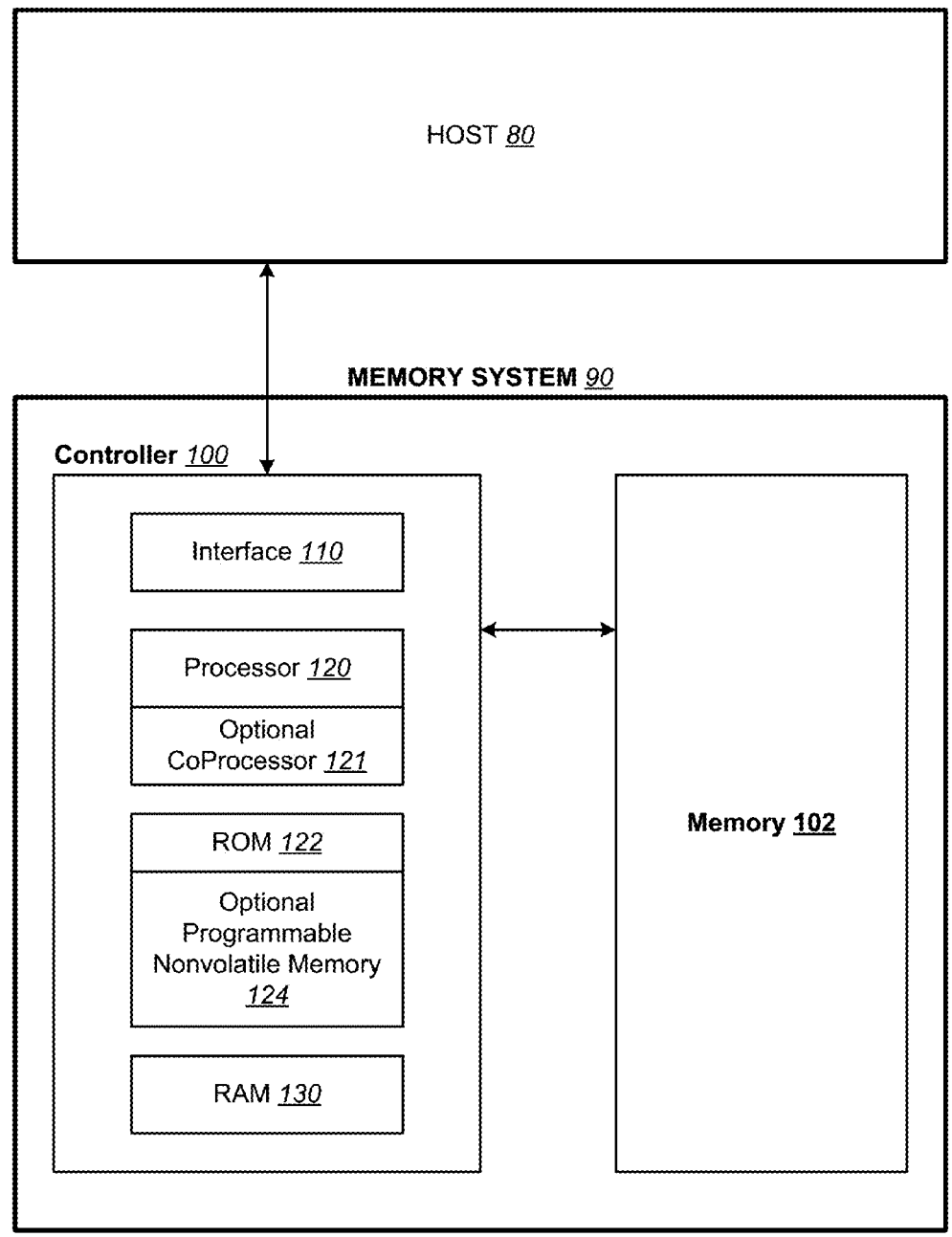
FIG. 1 illustrates schematically the main hardware components of a memory system suitable for implementing certain techniques described here.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

Physical Memory Structure

FIG. 1 illustrates schematically the main hardware components of a memory system suitable for implementing certain techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller may be formed as an ASIC (application specific integrated circuit) and the components included in such an ASIC generally depend on the particular application.

Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use non-volatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2:
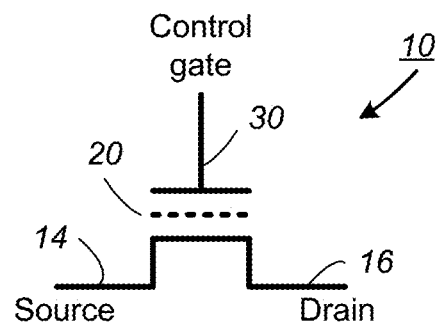
FIG. 2 illustrates schematically a non-volatile memory cell.

FIG. 2 illustrates schematically a non-volatile charge storage memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
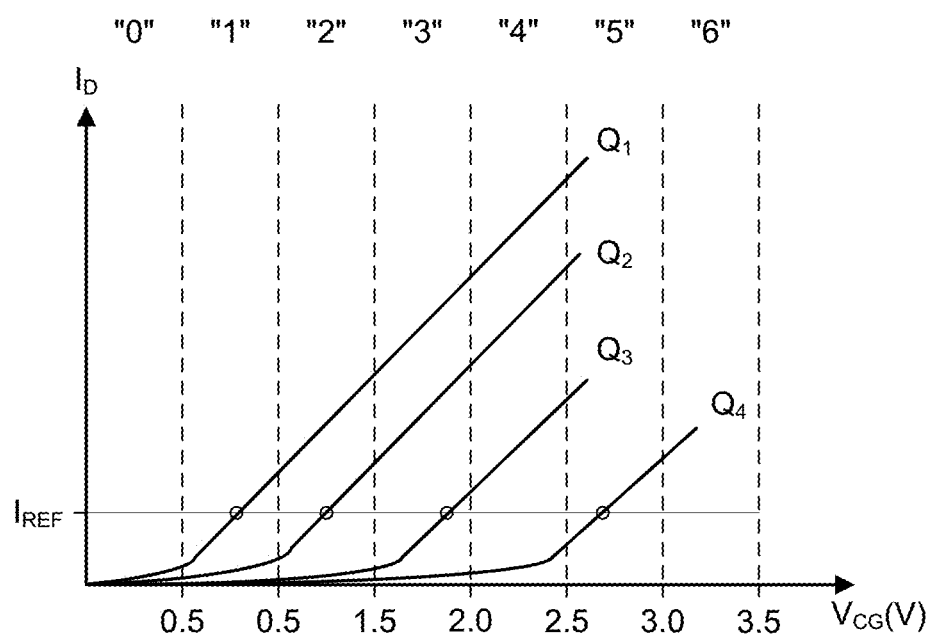
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG =0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
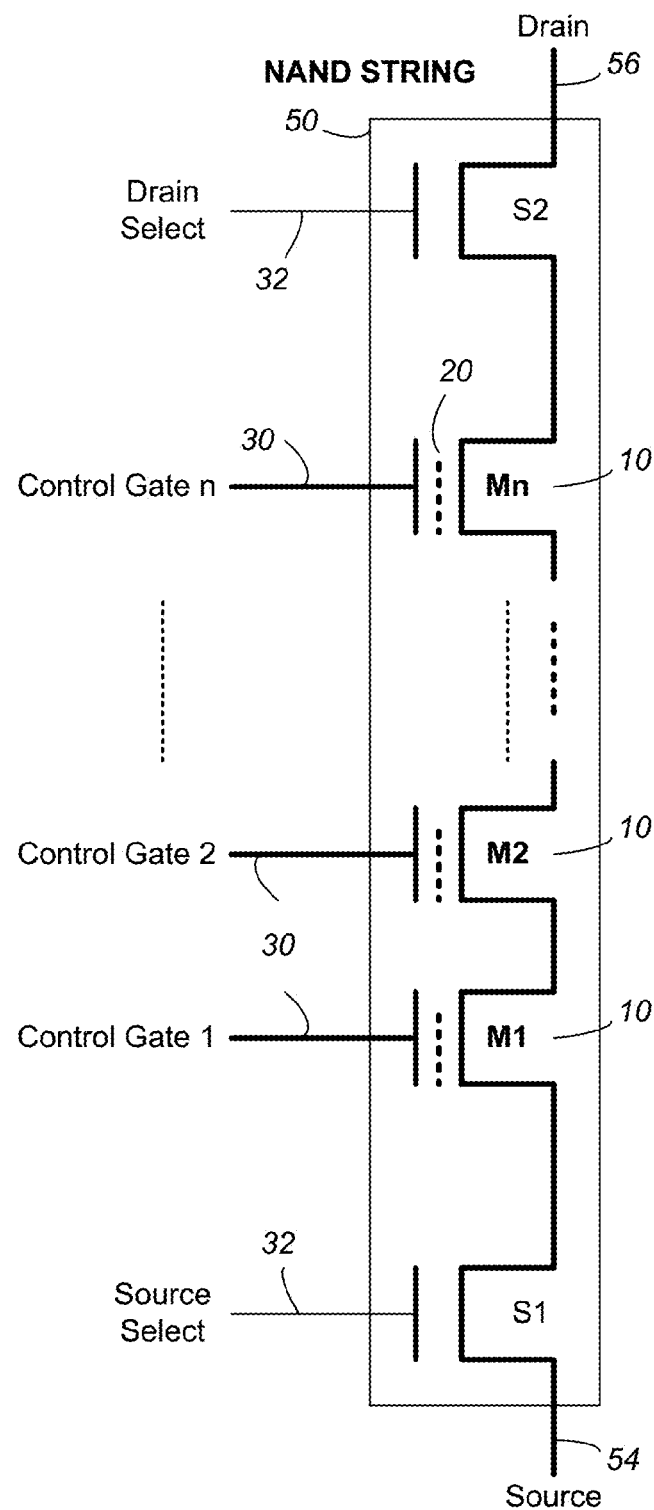
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
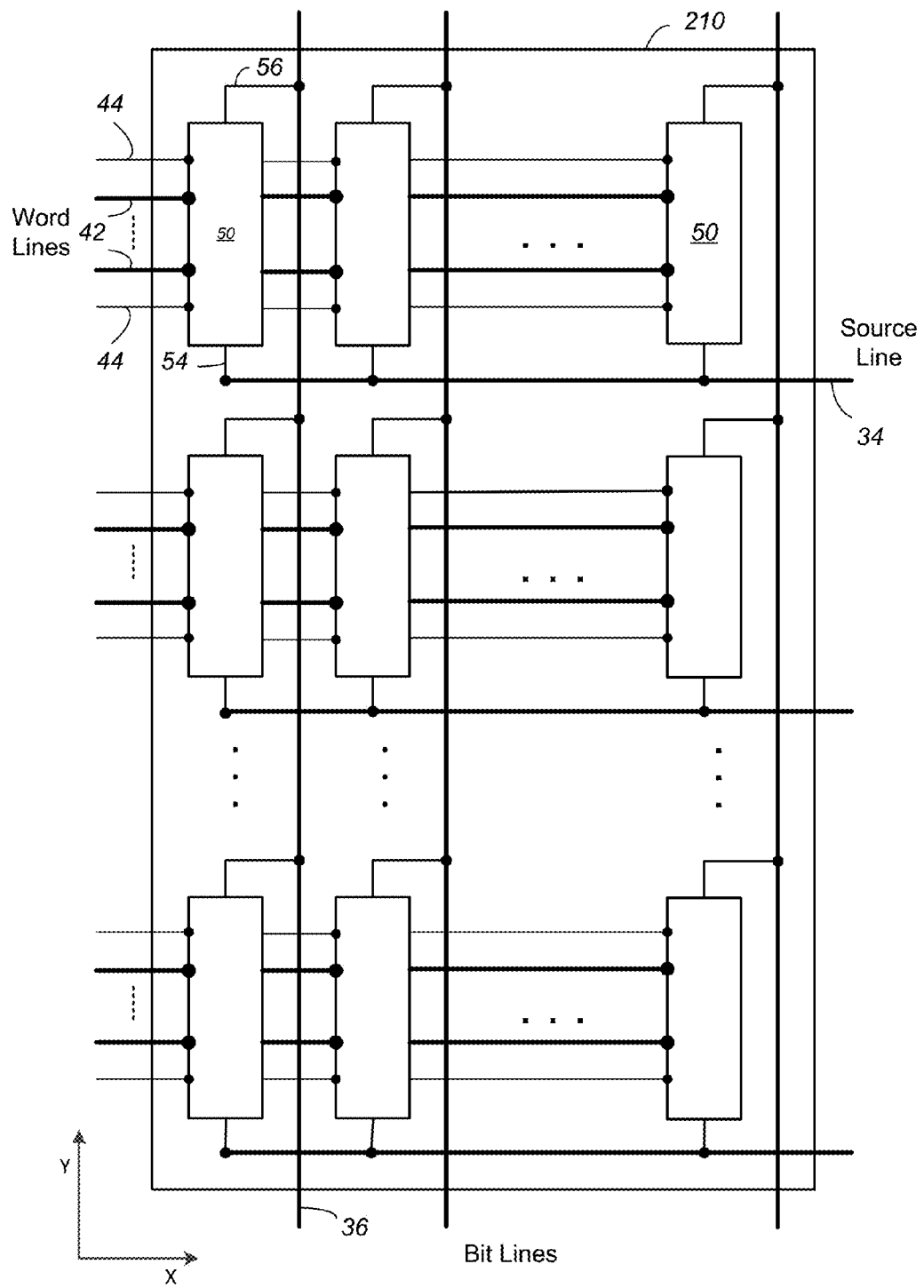
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
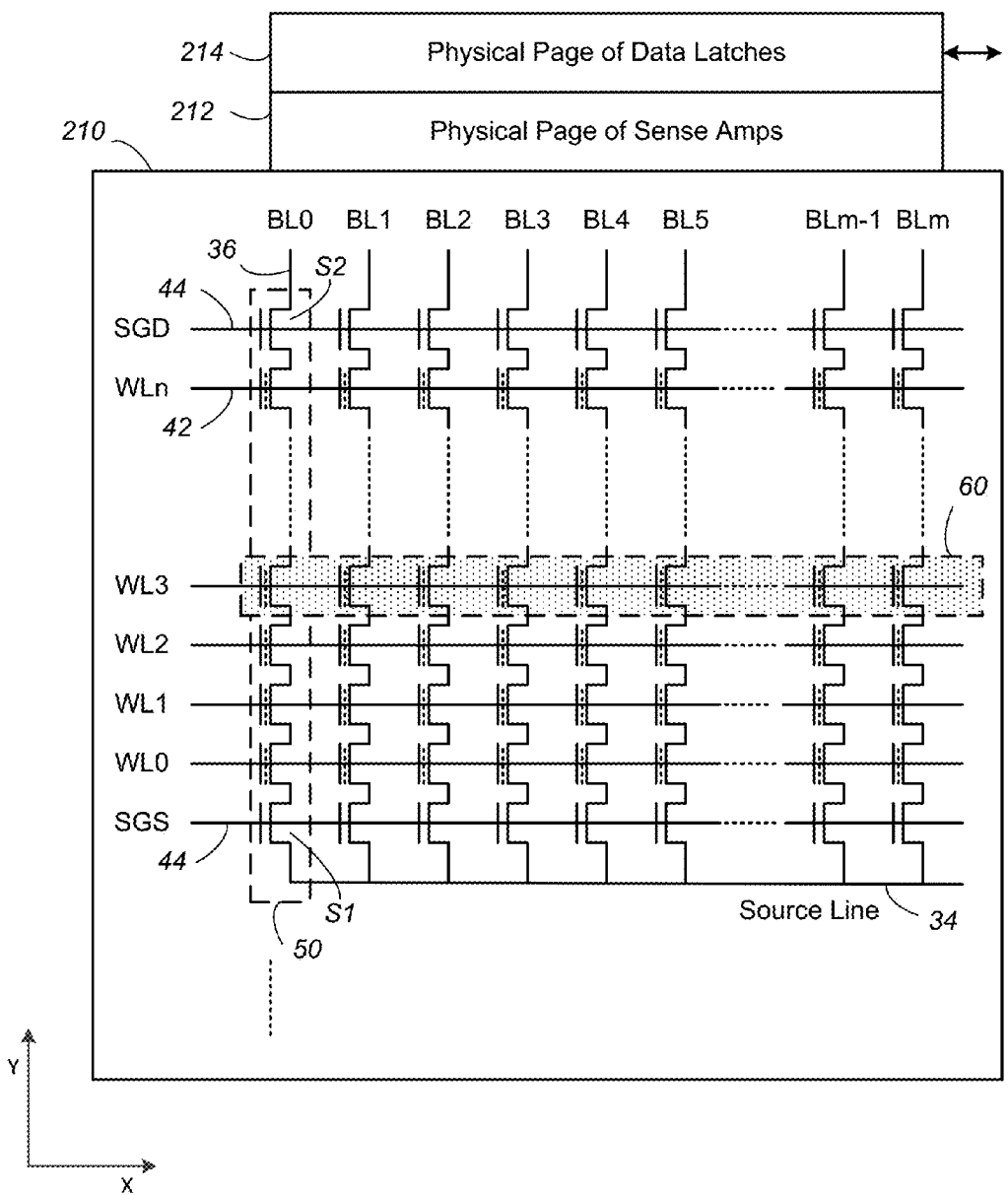
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first be emptied of charge. Programming then adds a desired amount of charge back to the floating gate. It does not generally support removing a portion of the charge from the floating gate to go from a more programmed state to a lesser one. This means that updated data cannot generally overwrite existing data and is generally written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". (The vertical axis represents the number of memory cells.) FIG. 68 illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "E" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "13G") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
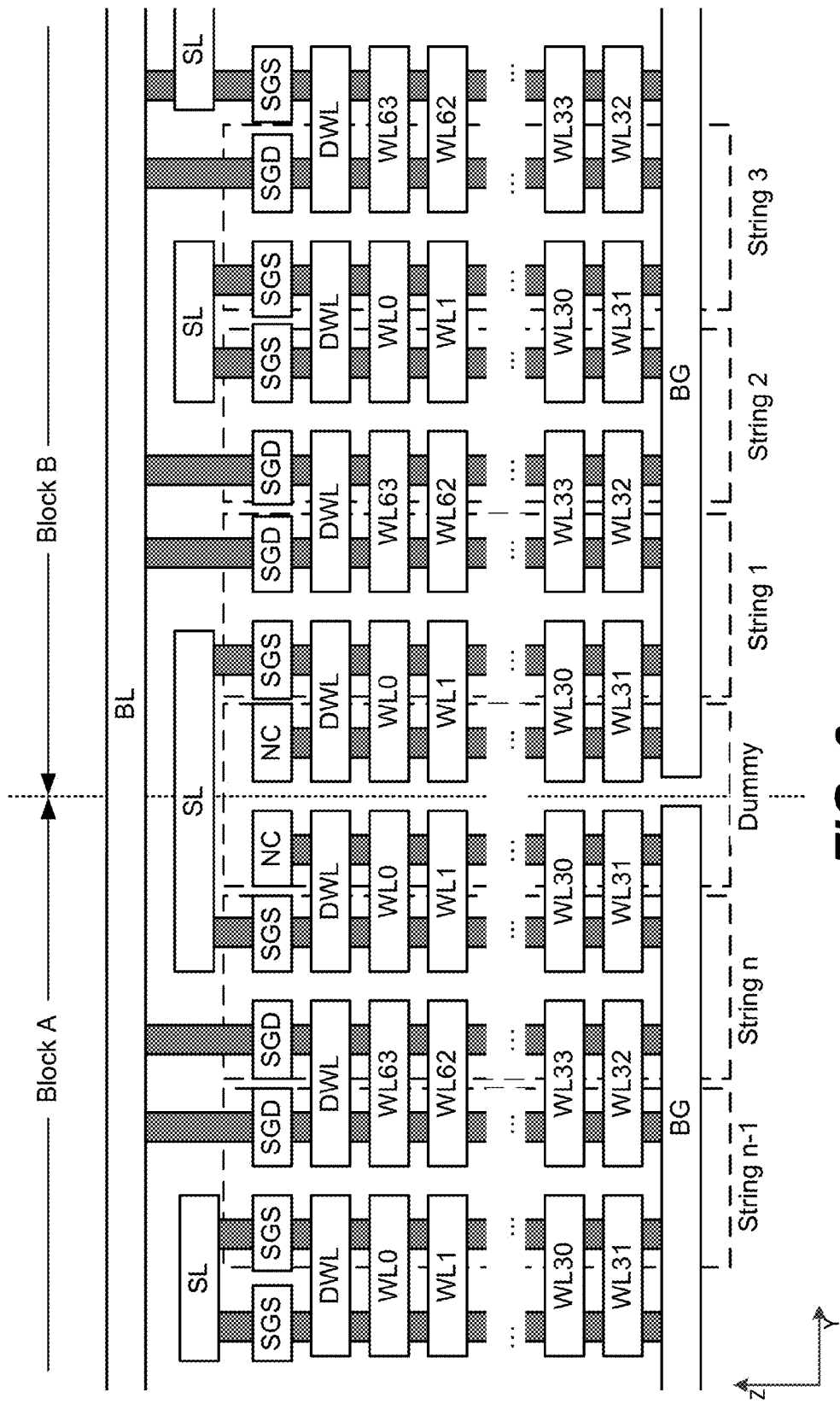
FIG. 9. shows an example of a 3-D NAND memory with U-shaped strings.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
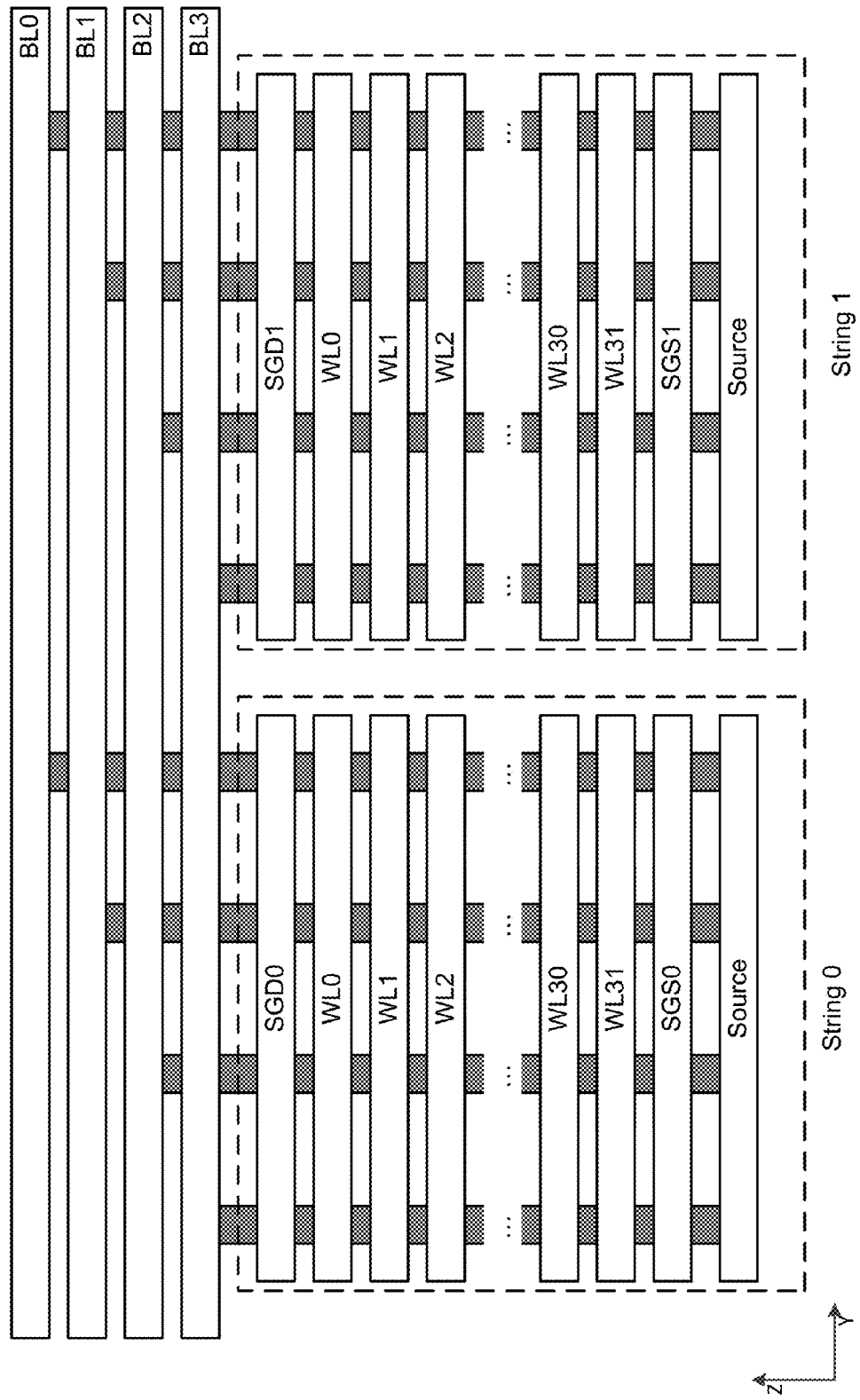
FIG. 10 shows an example of a 3-D NAND memory with straight NAND strings.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

While particular examples of two dimensional and three dimensional memory design are described above, it will be understood that techniques described here are applicable to a wide range of memories and are not limited to the examples described above (i.e. not limited to charge storage, or resistive memories, or limited to SLC or MLC, or to particular hardware).

Error Rate (BER) Scanning

In general, data is stored in memory cells by placing memory cells in conditions that are mapped to logical states. For example, threshold voltage of a charge storage memory cell such as a floating gate transistor may be mapped into two or more ranges that correspond to different logical states. Electrical resistance of a resistive element may be similarly mapped to two or more ranges that correspond to different logic states. In nonvolatile memories, memory cells retain their programmed condition for an extended period of time without further intervention. However, some change generally occurs over time for a variety of reasons so that data may not be read exactly as it was programmed. Some bits may be flipped (i.e. some cells that were programmed with a logic 0 are read as logic 1 and some cells programmed with a logic 1 are read as logic 0). The number of such flipped bits (bad bits) in a given portion of data may be expressed as the Bit Error Rate ("BER") which may be expressed as a fraction, ratio, percentage, or other suitable format. Other measures of error rate (other than BER) may also be used.

Data with a low BER may be corrected by ECC decoding prior to being sent to a host. Data with a higher BER may require more extensive ECC correction and may take significant time and resources to correct. Data with a high BER may be uncorrectable by ECC and may require some other form of correction or recovery. While ECC may be used to obtain BER, ECC decoding may take significant time and resources to determine BER for a portion of data and ECC detection and correction are generally performed in a controller or other IC that is separate from the memory IC so that data transfer may be required. In some cases, data may be read using different read parameters so that a lower error rate is obtained, or a high resolution read may be performed so that the probability of a particular bit being bad may be estimated. However, such approaches may require significant time and resources.

In some cases, it is desirable to monitor BER in a nonvolatile memory so that steps may be taken to prevent data from degrading to a point where it is UECC or requires significant time to read and/or decode. Some scanning of data to determine BER at different locations may be used to identify data with a BER that exceeds a limit. Such identified data may then be corrected and relocated (scrubbed) before it becomes further degraded. However, scanning in this way may require significant resources especially in large memory systems that contain a large amount of data to be scanned. In some memory systems such resources may not be easily made available. For example, there may be little or no idle time in some systems to allow such scanning because memory systems may be constantly executing host commands (e.g. memory systems in data servers).

Figure 11:
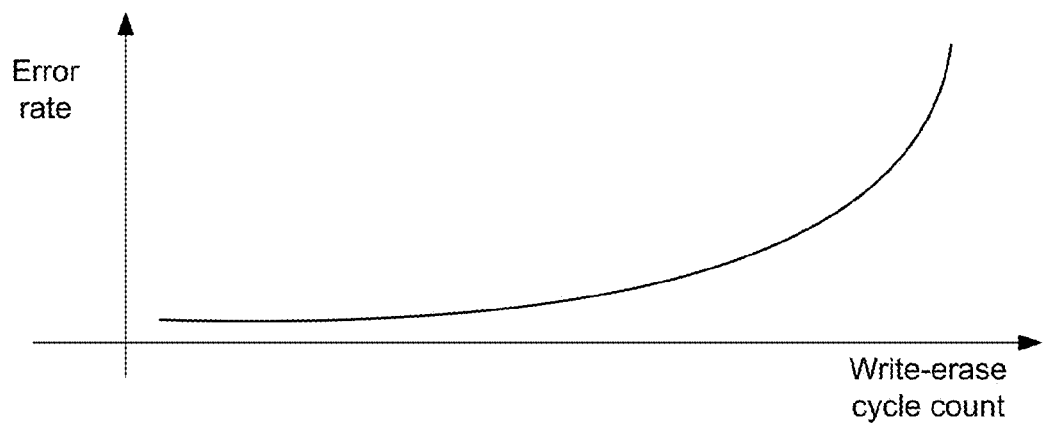
FIG. 11 shows increasing error rates with increased write-erase cycle count.

Some patterns may be found in BER distribution across a nonvolatile memory. FIG. 11 shows how error rate increases with the number of write-erase cycles ("hot count") that a block has experienced (this may apply to both SLC and MLC data and may be worse for upper page MLC data than lower page MLC data). If the error rate for a block exceeds a limit then the block may be considered as a bad block and may not subsequently be used for storage of user data. This reduces memory capacity and is generally undesirable. Heavily worn blocks generally have higher error rates than less worn blocks as shown. Cells in such blocks may be more prone to disturbance (e.g. read disturbs).

While high error rates may be associated with high write-erase cycle counts other patterns may also be found in some memories. In general, when data remains in a given location for an extended period of time it develops errors (i.e. data retention over time is not generally perfect). In general, the longer data remains in a particular location the more errors it develops. Such errors may be due to various factors including read disturbance (caused by reading the data, or reading nearby data which may require applying voltages to other word lines of the block), write disturbance (when writing data in nearby portions of the memory), erase disturbance (when erasing a nearby block), charge leakage, or other factors.

Figure 12A:
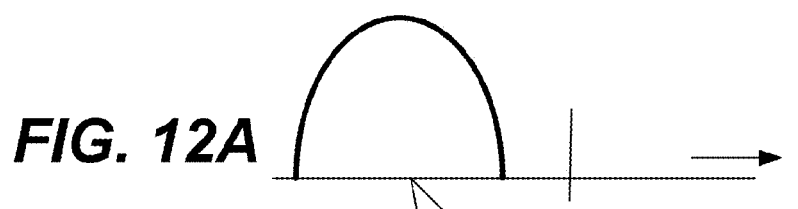
FIGS. 12A-C illustrate programming and degradation of stored data over time.
Figure 12B:
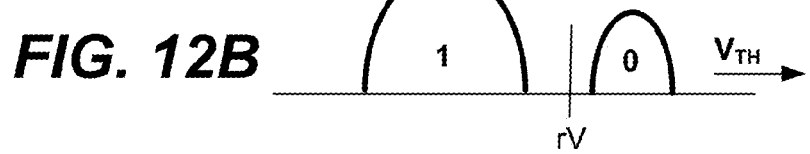
Figure 12C:
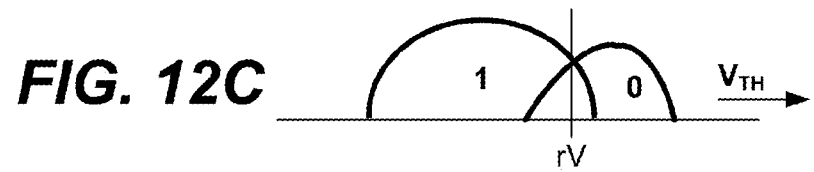

FIGS. 12A-12C illustrate data that is programmed and subsequently read from a charge storage SLC memory. FIG. 12A shows a population of memory cells that are in the erased state prior to programming. FIG. 12A shows threshold voltage $V_{TH}$ along the horizontal axis and the number of cells along the vertical axis. Subsequently, as shown in FIG. 12B, the memory cells are programmed so that threshold voltages of some memory cells are increased to a range that corresponds to a logic state 0 while threshold voltages of other memory cells remain substantially unchanged in a range that corresponds to a logic state 1 (mapping of logic states to threshold voltage ranges may also be the opposite with logic 1 corresponding to programmed cells and logic 0 corresponding to unprogrammed cells). Subsequently, as shown in FIG. 12C, threshold voltages of memory cells may change because of charge leakage, disturbance from other memory access operations (e.g. because of programming of other data, or reading operations), physical defects, or other factors affecting data retention. These distributions may cause some bad bits when the data is read. For example, the distribution of memory cells programmed to logic 0 extends below the read voltage rV so that these cells are misread as logic 1. Similarly, the distribution of memory cells programmed to logic 1 extends above rV so that these cells are misread as logic 0. In general, bad bits increase over time (i.e. data goes from distributions such as shown in FIG. 12B to distributions such as shown in FIG. 12C over time).

While the examples here are largely directed to SLC memory for simplicity of illustration, it will be understood that the profile or shape of a population of programmed memory cells in an MLC memory may be similarly identified and recorded. For example, in an MLC memory that stores two bits of data per cell using four states (e.g. E, A, B, C, as shown in FIG. 6A), the fraction of memory cells in each state, or a subset of the four states, may be recorded for subsequent comparison with corresponding fractions in read data.

One way to identify data that is likely to suffer from data retention problems is by using a time stamp or other indication of how long data has been stored so that data may be checked after some period. However, this would generally require significant overhead. Data that is exposed to read disturbs may be identified by monitoring read operations to identify data that is frequently read, and/or data that is close to data that is frequently read, that is likely to suffer from read disturbance. However, such tracking may require significant overhead.

An alternative approach to identifying data that may be degraded is to use write-erase cycle count as an indicator of how long data is likely to have been stored. A block with a high write-erase cycle count has been frequently written and erased and it is unlikely that data has remained in such a block for long. A block with a low write-erase cycle count has been infrequently written and erased and may have stored the same data for an extended period. Accordingly, such a block is likely to contain data that has data retention problems.

By focusing on blocks with low write-erase cycle counts, an error scanning scheme may efficiently identify data with high error rates without scanning a large number of blocks. A relatively small sample population of blocks with the smallest write-erase cycle counts may be scanned. If data in these blocks is acceptable then it may be unnecessary to scan other blocks.

Figure 13:
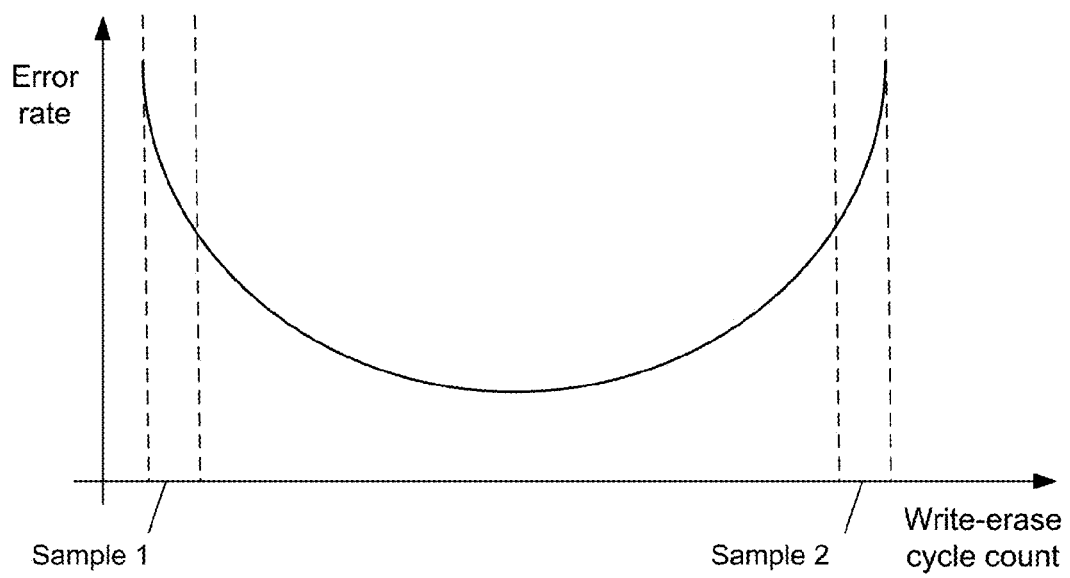
FIG. 13 shows error rates as a function of write-erase cycle count.

FIG. 13 shows an example of a distribution of error rate (e.g. BER) with write-erase cycle count. In this example, a sample population "sample 1" consists of a subset of blocks with the lowest write-erase cycle counts, which are likely to contain data that has been stored for an extended period of time, and thus have higher error rates than the overall population of blocks. The blocks of sample 1 may be scanned to estimate an error rate for sample 1 blocks and some further action may be taken when this error rate exceeds a limit.

While sampling low write-erase cycle count blocks may be performed alone, such a scheme may also be combined with other schemes. For example, FIG. 13 shows a subset of blocks with the highest write-erase cycle counts form another sample population "sample 2." These blocks show higher than average error rates because of the large number of write-erase cycles. The blocks of sample 2 may also be scanned to identify an error rate for sample 2. Some further action may be taken if this error rate exceeds a limit.

In some systems, wear leveling algorithms may be used to attempt to level out write-erase cycles by directing "hot" data to "cold" blocks (i.e. putting data that is frequently written in blocks that have low write-erase cycle counts) and placing cold data in hot blocks (i.e. putting data that is infrequently written in blocks with high write-erase cycle counts. This tends to even out the distribution of write-erase cycles across blocks so that blocks may wear at similar rates and few blocks wear out early. Thus, the U-shaped curve of FIG. 13 would be flattened by wear leveling. Such a wear-leveling scheme may be considered as an alternative to some schemes presented here. In some cases, some wear-leveling may be compatible with some schemes presented here so that write-erase cycle counts may be used for both selective BER scanning and wear leveling.

In some examples, sampling at either end of the write-erase cycle count spectrum as shown in FIG. 13 may be sufficient and no, sampling of the rest of the population may be performed. Because mechanisms for causing errors tend to concentrate such errors at both ends of the spectrum it may be sufficient to sample these ends and to assume that the population between (with write-erase cycle counts that are neither very high nor very low) has lower error rates.

In some cases, sampling may be similarly performed on both sample 1 and sample 2. In other cases, different approaches may be used. For example, sample 1 may contain a different number of blocks than sample 2. Different sampling schemes may be used. Acceptable error rate limits may be different for these populations. In other cases, both samples are treated similarly and may be considered as a single population that is sampled collectively, has a common error rate calculated, and is similarly managed. While the distribution shown in FIG. 13 is symmetric, with similar error rates at each end of the spectrum, asymmetric distributions may also occur in some memories and an asymmetric approach to sampling may be appropriate to such distributions.

In general, scanning a block includes reading data from one or more word line of the block so that the data can be evaluated (e.g. by ECC). A sample word line, or word lines, may be chosen based on expected error rates. For example, cells at ends of NAND strings may be more likely to be disturbed and to develop errors. Thus, in NAND memories word lines adjacent to select lines may be sampled and it may be assumed that if data along these word lines is acceptable then data along other word lines is also acceptable. In some 3-D memories, word lines in lower physical levels may have higher error rates than word lines of higher physical levels so that word lines in lower levels may be sampled. In some cases, an initial sampling step may sample only one word line (or a small number of word lines) with additional word lines sampled only if data in the first word line has an error rate above a limit. This generally keeps the sampling time low. Sampling may include reading all bits or only certain bits along a given word line. For example, in MLC memories, upper pages data may be sampled and it may be assumed that if the upper page data is acceptable then the lower page data is acceptable.

Figure 14:
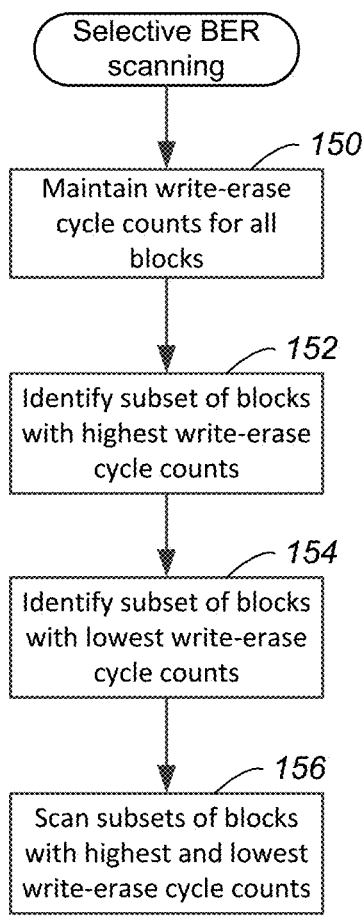
FIG. 14 illustrates an example of a scheme for selective scanning.

FIG. 14 illustrates a selective BER scanning scheme. Write-erase cycle counts are maintained for all blocks of the nonvolatile memory 150. A subset of blocks with the highest write-erase cycle counts is identified 152. Another subset of blocks with the lowest write-erase cycle counts is identified 154. Then, scanning for data with high error rates is performed on the two identified subsets 156 (e.g. blocks in each subset may be sampled). Other blocks may not be subject to such scanning so that the overhead associated with such scanning is kept to a low level.

Managing Blocks with High Error Rates

When scanning of selected blocks is performed, some blocks are likely to have high error rates. If blocks have error rates that indicate some danger of data becoming UECC (i.e. error rates above a threshold) then remedial action may be taken. For example, such blocks may be scrubbed by copying some or all of the data in the blocks to another location and correcting the data before rewriting it. An appropriate threshold for such remedial action may depend on the correction capacities of ECC schemes (or other redundancy schemes) that are used and on the rate at which data is degrading.

Even if data is not approaching a UECC condition, some action may be appropriate when error rates rise. As a memory system is used, errors generally increase. In particular, errors at both ends of the write-erase cycle count spectrum tend to increase because of additional write-erase cycle counts and increasing data retention problems over time. Initially, sampling may be limited to very small populations at either end of the spectrum because these may be the only blocks likely to experience significant errors. With continued use additional blocks that are not in these small samples may experience significant errors. Therefore, it may be appropriate to expand such samples as error rates rise. In particular, where the error rate for a particular sample population exceeds a threshold it may be an indication that error rates have increased to a level where additional blocks outside the sample population may have significant errors. Therefore, it may be appropriate to expand the sample population to include additional blocks.

Figure 15:
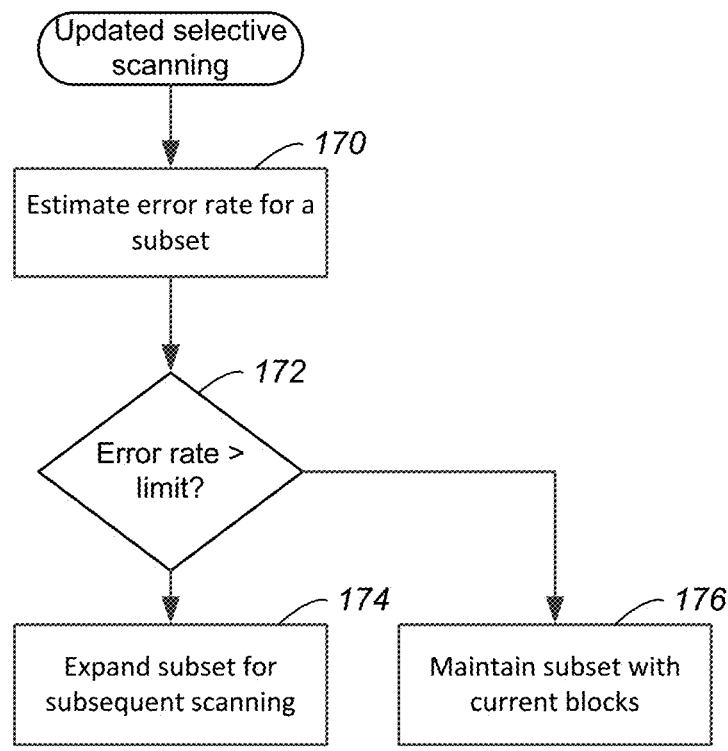
FIG. 15 illustrates an example of updating a selective scanning scheme.

FIG. 15 illustrates a scheme for updating a selective scanning operation in response to increased error rates. An error rate is estimated for a particular subset of blocks (e.g. blocks with the highest, or the lowest write-erase cycle counts) 170. The error rate is compared to a limit 172. If the error rate exceeds the limit then the subset is expanded for subsequent scanning so that it includes additional blocks 174. If the error rate remains below the limit then the subset remains with only the current blocks 176 (no additional blocks). The limit used for comparison 172 may be relatively low so that the sample may be expanded before a significant number of blocks outside the sample meet the threshold for remedial action. In general, it is desirable to focus on a small population while ensuring that blocks requiring remedial action are identified. An appropriate limit may be chosen accordingly.

When sampling data of a sample population an error rate for particular blocks may be obtained. This may be used to identify blocks for remedial action. Additionally, block error rates obtained from sampling may be used to determine an order for remedial action. Blocks with higher error rates may be subject to remedial action first. An ordered list of blocks requiring remedial action (ordered by error rate) may be maintained and remedial action may proceed in the listed order. Expansion of sample populations may be based on some aggregate of error rates of the individual blocks in the population. For example, an average error rate, weighted average, median error rate, or other aggregated value may be used.

Figure 16:
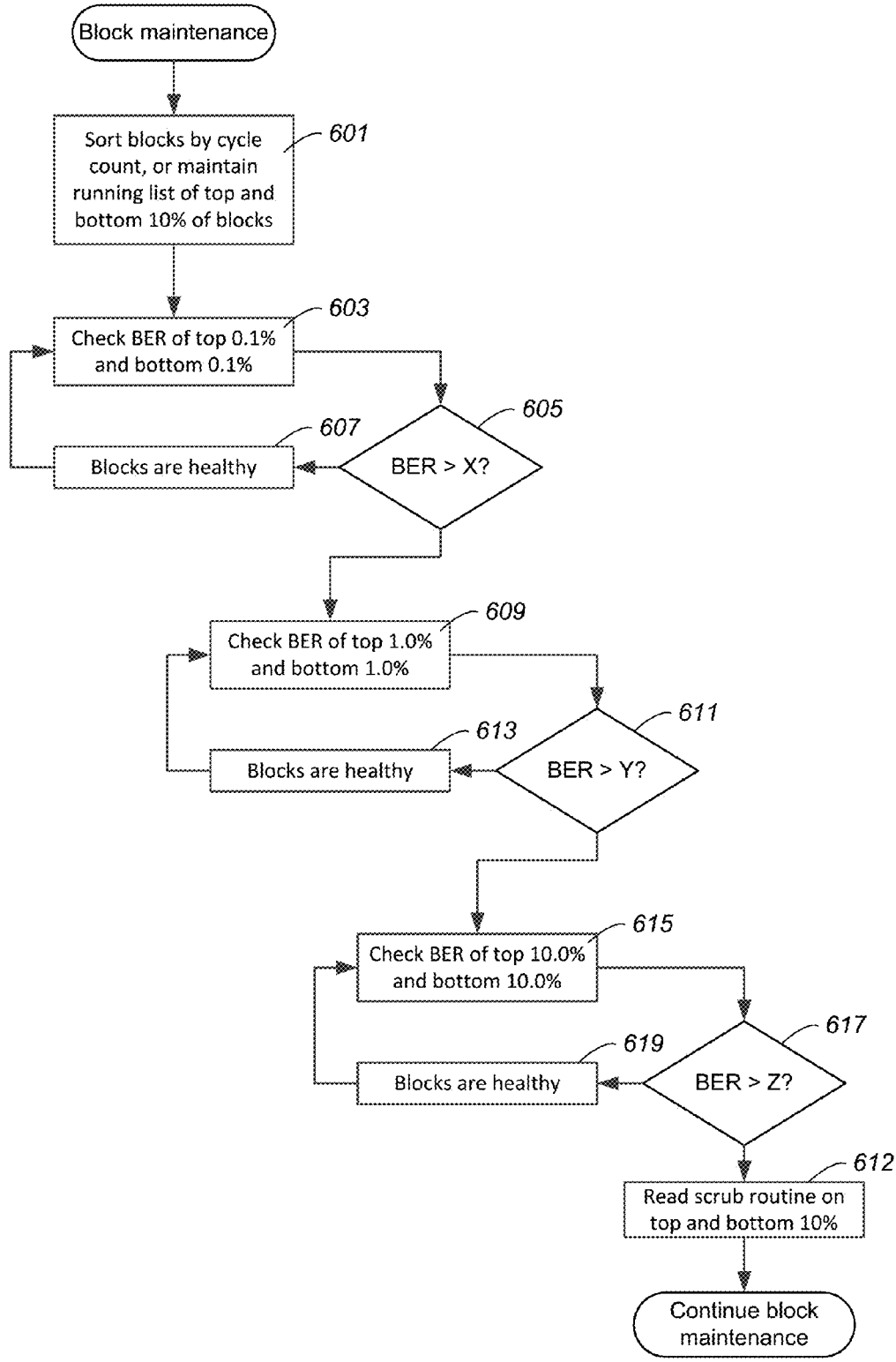
FIG. 16 illustrates an example of repeatedly updated selective scanning.

FIG. 16 illustrates a particular example of a block maintenance scheme. This scheme may be initiated when the memory system begins operation or may be initiated at some later time, after the memory system has been in operation for a period and a significant number of write-erase cycles have occurred. Blocks are sorted according to write-erase cycle count (or, alternatively, a running list of blocks with highest and lowest write-erase cycle counts are maintained, e.g. top 10% and bottom 10%) 601. Two sample populations, 0.1% of blocks with the top BERs, and 0.1% of blocks with the bottom BERs, are checked 603 and compared with a limit 605. If the BERs of these samples do not (individually or collectively) exceed the limit then blocks are determined to be healthy 607. If the BERs exceed the limit then sample populations are expanded to include the top 1% and bottom 1% of blocks and the expanded sample populations are checked 609. A comparison of BERs for the expanded samples with a limit (which may be different to the previous limit) is performed 611. If the BERs do not exceed the limit then the blocks are considered healthy 613. If the BERs exceed the limit then sample populations are expanded to include the top 10% and bottom 10% of blocks and these expanded sample populations are checked 615. A comparison of BERs for these expanded populations with a limit (which may be different to the two previous limits) is performed 617. If the BERs do not exceed the limit then the blocks are considered healthy 619. If the BERs exceed the limit then a read scrub routine is applied to the top and bottom 10% of blocks 621.

While the example of FIG. 16 shows samples expanded at the same time by the same amount (0.1% to 1.0% to 10%) in other examples these samples may be expanded at different times and may be expanded by different amounts depending on error rates found (i.e. updating may be asymmetric). Samples may be expanded by small increments (as little as a block at a time) or larger increments. While FIG. 16 shows read scrub routine applied after the top and bottom 10% of blocks have BERs greater than a limit, some scrubbing may occur at any suitable time. For example, at any given time that scanning finds a block that has a large number of errors the block may be scrubbed (or other remedial action may be taken). This does not necessarily mean that any expansion of the sample is required. Overall BER of the sample population may be acceptable and the block may simply reflect a processing defect or other block-specific issue. Thus, remedial action may occur at any time including prior to any expansion of the sample population.

Figure 17:
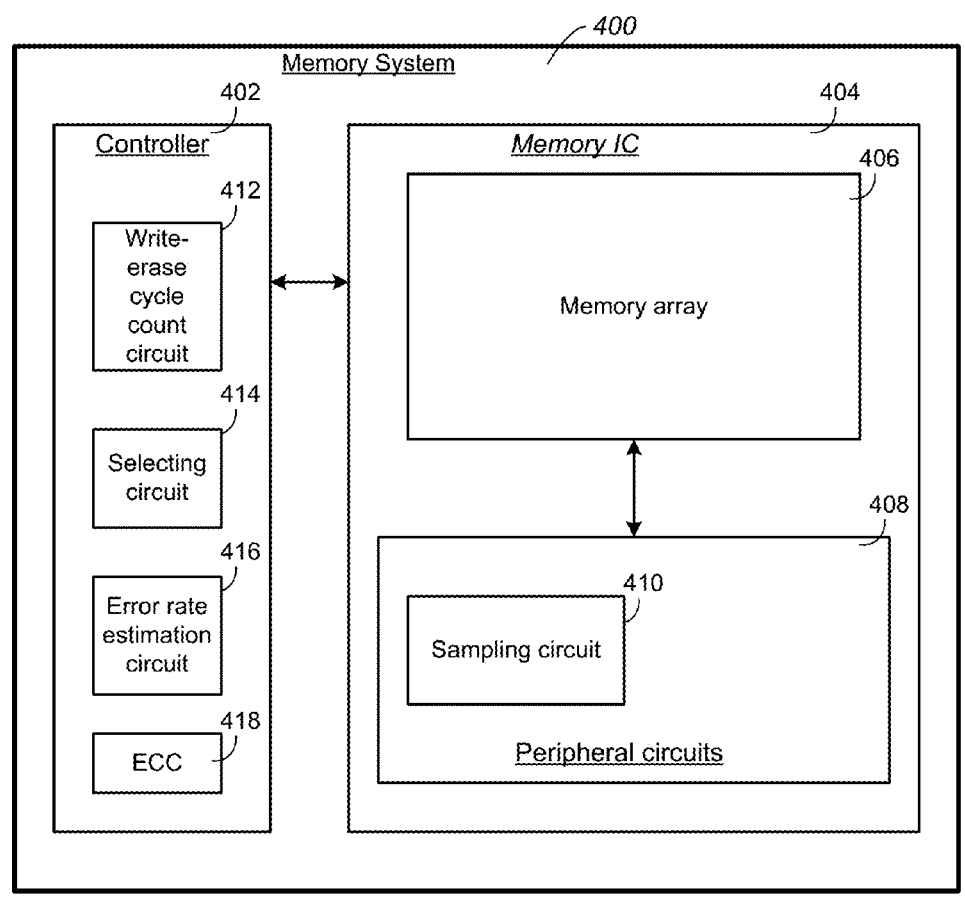
FIG. 17 shows an example of memory system hardware.

FIG. 17 shows an example of hardware that may be used to implement some aspects described above. Memory system 400 includes a memory controller 402 and memory IC 404. Other examples may have multiple memory ICs connected to a memory controller over one or more busses. Memory IC 404 includes a block erasable memory array 406 which may be planar or 3D, and may contain SLC blocks and/or MLC blocks. Peripheral circuits 408 in memory IC 404 include sampling circuits 410 which are configured to read data from one or more sample word line in a block. Memory controller 402 includes a write erase cycle count circuit 412 which maintains a write-erase cycle count (hot count) for each block in memory array 406. A selecting circuit 414 selects blocks in memory array 406 for sampling circuit 410 to sample. Error rate estimation circuit 416 estimates an error rate for a block and for a sample population of blocks. Error Correction Code (ECC) circuit 418 may perform error rate estimation functions with error rate estimation circuit 416. Memory controller 402 may be an ASIC with dedicated circuits for different functions. Memory controller 402 may contain some programmable logic circuits that are configurable to perform different functions (e.g. using Field Programmable Gate Arrays "FPGAs" or other configurable logic circuits). Memory controller 402 may contain some components that are configurable by firmware or other software so that circuits may be configured for a particular function by hardware, software, or a combination of hardware and software. Various alternative hardware arrangements are also possible and FIG. 17 is provided as a non-limiting example for illustration.

Conclusion

The foregoing detailed description has been presented for purposes of illustration and description. It is not intended to be exhaustive or limiting. Many modifications and variations are possible in light of the above teaching.

It is claimed:

1. A method of identifying high error rate data in a block-erasable nonvolatile memory comprising:
   (a) maintaining individual write-erase cycle counts for a plurality of blocks of the nonvolatile memory;
   (b) selecting a first subset of the plurality of blocks for error rate sampling, the first subset consisting of blocks with the lowest write-erase cycle counts of the plurality of blocks;
   (c) sampling data stored in the first subset of the plurality of blocks to estimate a first error rate for the first subset of the plurality of blocks;
   (d) comparing the first error rate with a first limit;
   (e) in response to determining that the first error rate exceeds the first limit, expanding the first subset to include additional blocks with next lowest write-erase cycle counts of the plurality of blocks; and
   (f) repeating steps (c)-(e).

2. The method of claim 1 further comprising:
   (g) selecting a second subset of the plurality of blocks for error rate sampling, the second subset consisting of blocks with the highest write-erase cycle counts of the plurality of blocks;
   (h) sampling data stored in the second subset of the plurality of blocks to estimate a second error rate for the second subset of the plurality of blocks;
   (i) comparing the second error rate with a second limit;
   (j) in response to determining that the second error rate exceeds the second limit, expanding the second subset to include additional blocks with the next highest write-erase cycle counts of the plurality of blocks; and
   (k) repeating steps (h)-(j).

3. The method of claim 2 wherein sampling data to estimate block error rates of the first and second subsets of the plurality of blocks is repeated during product use.

4. The method of claim 2 wherein sampling data to estimate block error rates of the first and second subsets of the plurality of blocks is repeated at write-erase cycle count intervals.

5. The method of claim 2 wherein the first subset of the plurality of blocks selected in step (b) consists of a first percentage of the plurality of blocks having the lowest write-erase cycle counts and the second subset of the plurality of blocks selected in step (g) consists of a second percentage of the plurality of blocks having the highest write-erase cycle counts.

6. The method of claim 5 wherein the first subset is expanded in step (e) to consist of a third percentage of the plurality of blocks having the lowest write-erase cycle counts, the third percentage being greater than the first percentage, and the second subset of the plurality of blocks is expanded in step (j) to consist of a fourth percentage of the plurality of blocks having the highest write-erase cycle counts, the fourth percentage being greater than the second percentage.

7. The method of claim 2 further comprising, in response to determining that an individual block of the first subset or the second subset of the plurality of blocks has a block error rate that exceeds a maximum block error rate performing data recovery operations on the individual block.

8. The method of claim 7 wherein the maximum block error rate corresponds to data that is correctable by an Error Correction Code (ECC) scheme that is used to encode data prior to storage in the plurality of blocks and to decode data that is read from the plurality of blocks.

9. The method of claim 8 wherein performing the data recovery operations on the individual block includes reading data from the individual block, correcting the data from the individual block using the ECC scheme, writing the data that is corrected to a destination block, and erasing the individual block.

10. The method of claim 2 wherein sampling data stored in the first subset of the plurality of blocks includes reading data from at least one word line in each block of the first subset of the plurality of blocks and sampling data stored in the second subset of the plurality of blocks includes reading data from at least one word line in each block of the second subset of the plurality of blocks.

11. The method of claim 10 wherein the first error rate is estimated by averaging individual error rates of all blocks of the first subset of the plurality of blocks and the second error rate is estimated by averaging individual error rates of all blocks of the second subset of the plurality of blocks.

12. The method of claim 10 further comprising sorting blocks of the first plurality of blocks and the second plurality of blocks in order of individual error rates and subsequently performing data recovery operations on the blocks of the first plurality of blocks and the second plurality of blocks in the order of individual error rates.

13. The method of claim I wherein the block erasable nonvolatile memory is monolithically formed in two or more physical levels of memory cells having an active area disposed above a silicon substrate.

14. A block erasable nonvolatile memory system comprising:
- a plurality of individually erasable blocks of memory cells;
- a write-erase cycle count circuit that maintains individual write-erase cycle counts for each of the plurality of individually erasable blocks;
- a data sampling circuit that samples stored data from selected blocks of the plurality of individually erasable blocks;
- an error rate estimation circuit that estimates an error rate from data sampled by the data sampling circuit; and
- a selecting circuit that selects the selected blocks for the sampling circuit to sample based on corresponding individual write-erase cycle counts maintained by the write-erase cycle count circuit, the selected blocks comprising a subset of the plurality of individually erasable blocks with the lowest individual write-erase cycle counts of the plurality of individually erasable blocks, with additional blocks added to the subset when the error rate estimation circuit indicates that the error rate is greater than a limit.

15. The block erasable nonvolatile memory system of claim 14 wherein the selected blocks further comprise another subset of blocks with the highest individual write-erase cycle counts of the plurality of blocks.

16. The block erasable nonvolatile memory of claim 15 wherein the data sampling circuit is configured to perform sampling repeatedly during product use.

17. The block erasable nonvolatile memory of claim 16 wherein the data sampling circuit is configured to perform the sampling repeatedly at write-erase cycle count intervals.

18. The block erasable nonvolatile memory system of claim 15 wherein the selecting circuit is initially configured to select selected blocks that consist of about 0.1% of the plurality of blocks with the lowest write-erase cycle counts and about 0.1% of the plurality of blocks with the highest write-erase cycle counts and to subsequently add blocks to the subset and to the additional subset.

19. The block erasable nonvolatile memory system of claim 14 further comprising: a data recovery system that recovers data from blocks containing data with an error rate that exceeds a maximum block error rate.

20. The block erasable nonvolatile memory system of claim 19 further comprising an Error Correction Code (ECC) circuit that encodes data prior to storage in the block erasable nonvolatile memory and decodes data that is read from the block erasable nonvolatile memory, the ECC circuit having a correcting capacity that is greater than the maximum block error rate.

21. The block erasable nonvolatile memory system of claim 20 wherein the data with the error rate that exceeds the maximum block error rate is corrected by the ECC circuit and stored in another block.

22. The block erasable nonvolatile memory system of claim 14 wherein the data sampling circuit is configured to read data from at least one word line of each of the selected blocks.

23. The block erasable nonvolatile memory system of claim 22 wherein the error rate estimation circuit estimates the first error rate from an average of errors in read data from each of the selected blocks.

24. The block erasable nonvolatile memory system of claim 14 wherein the block erasable nonvolatile memory is monolithically formed in two or more physical levels of memory cells having an active area disposed above a silicon substrate.

25. A method of identifying high error rate data in a block-erasable nonvolatile memory comprising:
- (a) maintaining individual write-erase cycle counts for a plurality of blocks of the nonvolatile memory;
- (b) selecting a first subset of the plurality of blocks for error rate sampling, the first subset consisting of blocks with the lowest write-erase cycle counts of the plurality of blocks;
- (c) sampling data stored in the first subset of the plurality of blocks by reading at least one word line from each block of the first subset of the plurality of blocks to estimate a first error rate for the first subset of the plurality of blocks;
- (d) comparing the first error rate with a first limit;
- (e) in response to determining that the first error rate exceeds the first limit, expanding the first subset to include additional blocks with next lowest write-erase cycle counts of the plurality of blocks;
- (f) repeating steps (c)-(e) at write erase cycle count intervals;
- (g) selecting a second subset of the plurality of blocks for error rate sampling, the second subset consisting of blocks with the highest write-erase cycle counts of the plurality of blocks;
- (h) sampling data stored in the second subset of the plurality of blocks by reading at least one word line in each block of the second subset of the plurality of blocks to estimate a second error rate for the second subset of the plurality of blocks;
- (i) comparing the second error rate with a second limit;
- (j) in response to determining that the second error rate exceeds the second limit, expanding the second subset to include additional blocks with the next highest write-erase cycle counts of the plurality of blocks;
- (k) repeating steps (h)-(j) at write erase cycle count intervals; and
- (l) sorting blocks of the first plurality of blocks and the second plurality of blocks in order of individual error rates and subsequently performing data recovery operations on the blocks of the first plurality of blocks and the second plurality of blocks in the order of individual error rates.

* * * * *